(12) United States Patent
Li

(10) Patent No.: US 11,988,705 B2
(45) Date of Patent: May 21, 2024

(54) CARRIER MECHANISM AND PROCESSING EQUIPMENT INCLUDING THE CARRIER MECHANISM

(71) Applicant: HON. PRECISION, INC., Taichung (TW)

(72) Inventor: Tzu-Wei Li, Taichung (TW)

(73) Assignee: HON. PRECISION, INC., Taichung (TW)

( * ) Notice: Subject to any disclaimer, the term of this patent is extended or adjusted under 35 U.S.C. 154(b) by 390 days.

(21) Appl. No.: 17/382,490

(22) Filed: Jul. 22, 2021

(65) Prior Publication Data
US 2022/0252659 A1 Aug. 11, 2022

(30) Foreign Application Priority Data
Feb. 8, 2021 (TW) .................................. 110104731

(51) Int. Cl.
*G01R 31/28* (2006.01)
(52) U.S. Cl.
CPC ..... *G01R 31/2808* (2013.01); *G01R 31/2817* (2013.01)
(58) Field of Classification Search
CPC ............ G01R 31/2808; G01R 31/2817; G01R 31/2867; B23Q 1/4828; B05B 1/24; H01L 21/68764
See application file for complete search history.

(56) References Cited

U.S. PATENT DOCUMENTS

| | | | | |
|---|---|---|---|---|
| 6,155,768 A | * | 12/2000 | Bacchi | H01L 21/68707 414/416.03 |
| 6,450,755 B1 | * | 9/2002 | Cameron | H01L 21/67781 414/941 |
| 6,547,510 B1 | * | 4/2003 | Beaulieu | H01L 21/68707 414/744.5 |
| 9,586,152 B1 | * | 3/2017 | Lee | G09B 9/04 |
| 11,541,493 B2 | * | 1/2023 | Yang | B23Q 1/4828 |

FOREIGN PATENT DOCUMENTS

| | | | |
|---|---|---|---|
| KR | 20110093301 | * | 8/2011 |
| TW | 202043126 A | | 12/2020 |
| TW | I715515 B | | 1/2021 |

* cited by examiner

*Primary Examiner* — Vinh P Nguyen
(74) *Attorney, Agent, or Firm* — Best & Flanagan LLP

(57) ABSTRACT

The present disclosure provides a carrier mechanism including at least one rotator, a supporting unit, and a driving unit. The rotator rotates about an axis and has a gradually enlarged cam surface. The supporting unit has at least one carrier. The carrier has a first passive member and a second passive member contacting two sides of the rotator respectively. The driving unit has at least one driver to drive the rotator to rotate about the axis so as to push the first passive member and the second passive member. Thus, the carrier can precisely adjust the location of the carrier.

18 Claims, 15 Drawing Sheets

CARRIER MECHANISM AND PROCESSING EQUIPMENT INCLUDING THE CARRIER MECHANISM

FIELD OF THE INVENTION

The present disclosure relates to a carrier mechanism which is lighter, capable of adjusting the location of carrier, and improving the efficiency of processing.

BACKGROUND OF THE INVENTION

A processing device, such as a transporting device or a testing device, usually drives the processing member, such as a pressing member or a support table, to work on the electronic components via a carrier mechanism. For example, the processing member in a transporting device is a support table to support and transport the electronic components. For another example, the processing in a testing device is a pressing member to move and press the electronic components. No matter what kind of devices, the accuracy of position is important, especially to tiny electronic components. In a testing device, the pressing member grasps the electronic component by the suction nozzle and moves it to the testing seat. When the junctions of the electronic component are not aligned to the probes of the testing seat precisely, the test may fail. Thus, the carrier mechanism has to move the pressing member along X-direction and Y-direction, and also rotate horizontally to adjust the position of the electronic components.

SUMMARY OF THE INVENTION

One of the objects of the present invention is to provide a carrier mechanism including at least one rotator, a supporting unit, and a driving unit. The rotator rotates about an axis and has a gradually enlarged cam surface. The supporting unit has at least one carrier. The carrier has a first passive member and a second passive member contacting two sides of the rotator respectively. The driving unit has at least one driver to drive the rotator to rotate about the axis so as to push the first passive member and the second passive member. Thus, the carrier can precisely adjust the location of the carrier.

One of the objects of the present invention is to provide a carrier mechanism whose rotator includes a plurality of rollers. The first passive member and the second passive member contact different rollers respectively. When the rollers rotate about a same axis, the rollers push the first passive member and the second passive member respectively to make the carrier move linearly.

One of the objects of the present invention is to provide a carrier mechanism whose rotator has a cam surface on the outer face thereof. The rotator rotates about the axis. Outer surfaces of the first passive member and the second passive member contact the rotator to reduce the backlash so that the carrier can move smoothly for adjustment.

One of the objects of the present invention is to provide a carrier mechanism whose rollers includes a first rotator and a second rotator. The first rotator rotates about a first axis, and the second rotator rotates about a second axis. The at least carrier of the supporting unit includes a first carrier and a second carrier. The first carrier has the first passive member and the second passive member. The first passive member and the second passive member contact the first rotator. The second carrier is movably disposed on the first carrier and has a third passive member and a fourth passive member. The third passive member and the fourth passive member contact the second rotator. The at least one driver of the driving unit includes a first driver and a second driver to drive the first rotator and the second rotator to rotate respectively. The first rotator and the second rotator adjust degrees of freedom of the first carrier and the second carrier along different directions.

One of the objects of the present invention is to provide a carrier mechanism whose first rotator includes a first roller and a second roller. The first roller and the second roller contact the first passive member and the second passive member of the first carrier respectively. The second rotator includes a third roller and a fourth roller. The third roller and the fourth roller contact the third passive member and the fourth passive member of the second carrier. When the first rotator and the second rotator rotate, the backlash can be reduced, and the degrees of freedom of first carrier and the second carrier along different linear directions can be adjusted.

One of the objects of the present invention is to provide a carrier mechanism whose supporting unit further has a third carrier. The third carrier is disposed on the first carrier and has a fifth passive member. The driving unit has a third driver. The third driver drives the fifth passive member of the third carrier via an eccentric axle so as to adjust degree of freedom of horizontal rotation of the third carrier. Thus, the positions of the first carrier, the second carrier, and the third carrier can be precisely adjusted.

One of the objects of the present invention is to provide a carrier mechanism further including at least one receiver. The receiver is movably disposed on the first carrier.

One of the objects of the present invention is to provide a carrier mechanism having a track assembly arranged between the first carrier and the receiver. The receiver has a protection structure at a side thereof. The protection structure has a first plate and a second plate spacedly arranged on a position corresponding to the track assembly. An erected plate is formed at an opposite side of the receiver. When a force is exerted on the receiver, the force is transmitted to the first carrier via the erected plate so that the track assembly is prevented from damaging. Thus, the track assembly becomes more durable, and the cost can be reduced.

One of the objects of the present invention is to provide a processing equipment including a machine, a feeding device, a collecting device, a processing device having the carrier mechanism, and a controlling device. The feeding device is disposed on the machine and has at least one feeding receiver for receiving electronic components to be processed. The collecting device is disposed on the machine and has at least one collecting receiver for receiving electronic components which have been processed. The processing device is disposed on the machine and has at least one processing member and the carrier mechanism. The processing member is disposed on the carrier mechanism to work on the electronic components. The controlling device controls collaboration of the feeding device, the collecting device, and the processing device, so as to process automatically.

The present invention will become more obvious from the following description when taken in connection with the accompanying drawings, which show, for purpose of illustrations only, the preferred embodiment(s) in accordance with the present invention.

BRIEF DESCRIPTION OF THE DRAWINGS

The present disclosure can be more fully understood by reading the following detailed description of the embodiment, with reference made to the accompanying drawings as follows.

DETAILED DESCRIPTION OF THE PREFERRED EMBODIMENTS

Figure 1:
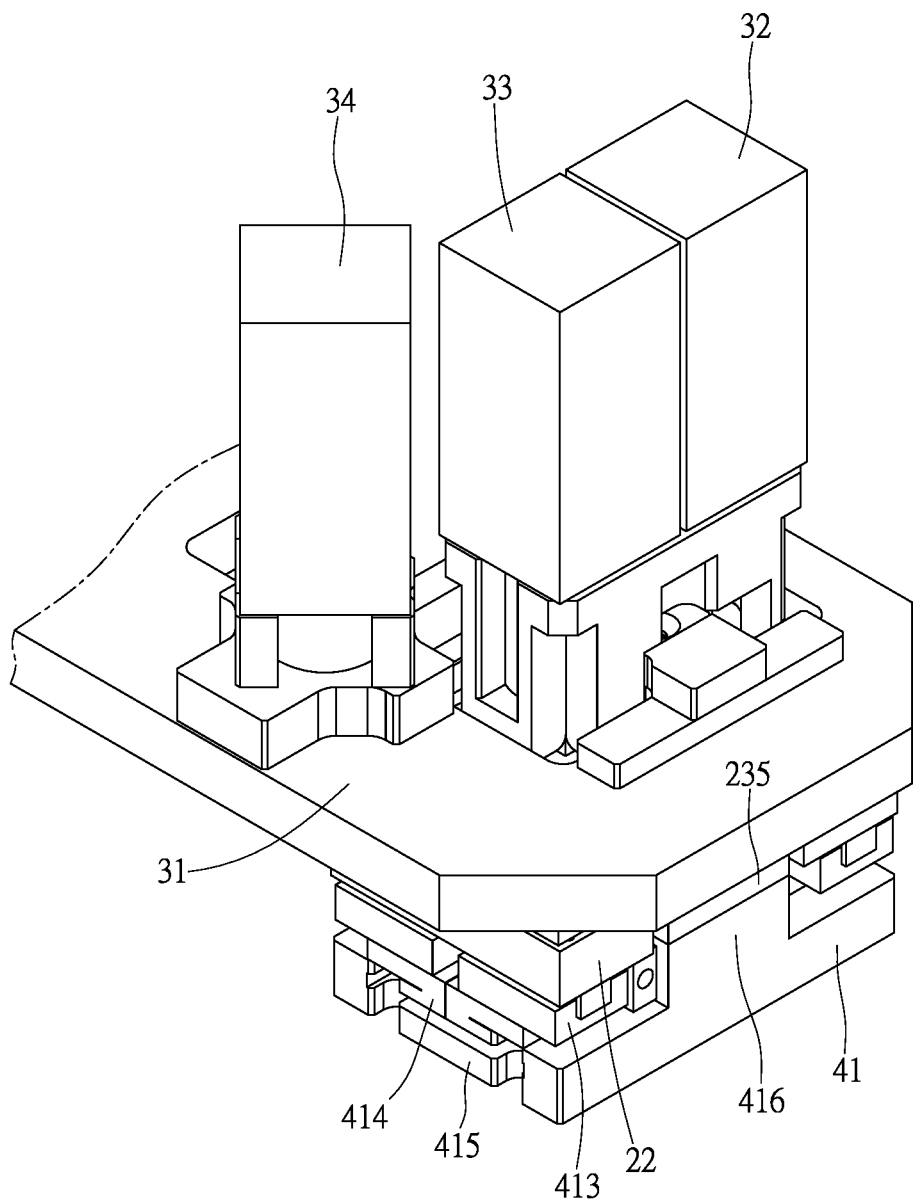
FIG. 1 is a stereogram showing a carrier mechanism of the present invention.

Please refer to FIG. 1 to FIG. 7, the carrier mechanism of the present invention includes at least one rotator, a supporting unit, and a driving unit. The carrier mechanism can further include a receiver and at least one track assembly.

The at least one rotator is rotatable about an axis. Specifically, the rotator has at least one roller which is a cam. The number of the roller can be alternated depending on needs. For example, the number of the roller can be one, and the roller drives a plurality of passive members of the supporting unit to move. The number of the roller can be multiple, and the rollers drive the passive members of the supporting unit to move respectively.

In the present embodiment, the at least one rotator includes a first rotator and a second rotator. The first rotator has a first roller 11 and a second roller 12. The first roller 11 and the second roller 12 are disposed on a first seat 151 and rotatable about a first axis L1. Each of the first roller 11 and the second roller 12 is a cam and has a gradually enlarged peripheral surface. The second roller 12 is located below the first roller 11. The higher arc section and the lower arc section of the second roller 12 is staggered from the higher arc section and the lower arc section of the first roller 11. The first roller 11 and the second roller 12 can be formed in a single piece or independent pieces. In the present embodiment, the first roller 11 and the second roller 12 are formed integrally in a single piece.

The second rotator has a third roller 13 and a fourth roller 14. The third roller 13 and the fourth roller 14 are disposed on a second seat 152 and rotatable about a second axis L2. Each of the third roller 13 and the fourth roller 14 is a cam and has a gradually enlarged peripheral surface. The fourth roller 14 is located below the third roller 13. The higher arc section and the lower arc section of the fourth roller 14 is staggered from the higher arc section and the lower arc section of the third roller 13. The third roller 13 and the fourth roller 14 can be formed in a single piece or independent pieces. In the present embodiment, the third roller 13 and the fourth roller 14 are formed integrally in a single piece. However, the first rotator and the second rotator can be just connected to the driving unit instead of connecting to the first seat 151 and the second seat 152.

The supporting unit has at least one carrier. The carrier has a first passive member and a second passive member. The first passive member and the second passive member are driven to move by the rotator. Specifically, the first passive member and the second passive member contact the rotator to reduce the backlash. For example, the first passive member and the second passive member contact two sides of a roller of the rotator respectively, or contact different rollers of the rotator respectively. Besides, the number of the carrier can be alternated depending on needs. For example, the at least one carrier of the supporting unit includes a first carrier 21 and a second carrier 22. The degrees of freedom of the first carrier 21 and the second carrier along different direction, such as X direction and Y direction, can be adjusted. In other possible embodiments, the at least carrier of the supporting unit includes the first carrier 21, the second carrier 22, and a third carrier 23. The degrees of freedom of the first carrier 21 and the second carrier along different direction, such as X direction and Y direction, can be adjusted. The degree of freedom of horizontal rotation (angle of θ) of the third carrier 23 can be adjusted.

Each of the first passive member and the second passive member can be a roller, a protrusion, a wall, a rod, or an elastic member. In addition, each of the first passive member and the second passive member can have a peripheral face which is compressible and deformable. For example, the roller is covered with a soft material to make the peripheral face of the roller compressible, and the second passive member can be an elastic member to pull the carrier to move reversely.

In the present embodiment, the at least one carrier of the supporting unit includes the first carrier 21, the second carrier 22, and the third carrier 23. The first carrier 21 has a first receiving space 211 for the first roller 11 and the second roller 12 of the first rotator to insert through. A first base piece 212 and a second base piece 213 are arranged at two sides of the first receiving space 211 along a first direction, such as Y-direction. The first base piece 212 is disposed with the first passive member 214 which is a roller. The first passive member 214 is located at a side of the first roller 11, and the first passive member 214 keeps contacting the first roller 11. The second base piece 213 is disposed with the second passive member 215 which is a roller, and the second passive member 215 and the first passive member 214 are located at two different sides of the first rotator. The second passive member 215 is located at a side of the second roller 12, and the second passive member 215 keeps contacting the second roller 12. Besides, the first carrier 21 is formed with a first through hole 216 for the third roller 13 and the fourth roller 14 of the second rotator to insert through. The first carrier 21 has passing bay portions 217 at two sides. In other possible embodiments, the first base piece 212 and the second base piece 213 can be arranged along a second direction, such as X-direction, in the first receiving space 212.

The second carrier 22 is movably disposed on the first carrier 21 and has a third passive member and a fourth passive member. The third passive member and the fourth passive member are driven to move by the second rotator. In the present embodiment, a first track assembly 221 is arranged along the second direction, such as X-direction, below the second carrier 22 and the first carrier 21. A first track of the first track assembly 221 is disposed on the first carrier 21, and a first sliding seat is disposed on the second carrier 22. The second carrier 22 moves along X-direction below the first carrier 21 via the first track assembly 221. The second carrier 22 has a second receiving space 222 for the third roller 13 and the fourth roller 14 of the second rotator to insert through. A third base piece 223 and a fourth base piece 14 are arranged along a second direction, such as X-direction, at two sides of the second receiving space 222. The third base piece 223 is disposed with the third passive member 225 which is a roller. The third passive member 225 is located at a side of the third roller 13, and the third passive member 225 contacts the third roller 13. Besides, a first intermediary member 226 is arranged at a side of the third base piece 223 remote from the second receiving space 222. However, in other possible embodiments, the third passive member and the first intermediary member can be disposed on different base pieces depending on needs. The third base piece 224 is disposed with the fourth passive member 227 which is a roller. The fourth passive member 227 and the third passive member 225 are arranged at two sides of the second rotator. The fourth passive member 227 contacts the fourth roller 14. In addition, the fourth base piece 224 is disposed with a second intermediary member 228.

The third carrier 23 is disposed on the first carrier 21 and has a fifth passive member. In the present embodiment, the third carrier 23 is arranged with the fifth passive member which is a recess 231. The third carrier 23 is arranged above the first carrier 21 and is disposed with the first seat 151 and the second seat 152. A second track assembly 232 is arranged along the first direction, such as Y-direction, between the third carrier 23 and the first carrier 21. A second track of the second track assembly 232 is disposed on the third carrier 23, and a second sliding seat is disposed on the first carrier 21 so that the first carrier 21 moves along Y-direction below the third carrier 23 via the second track assembly 232. The third carrier 23 is formed with a second through hole 233 at a position thereof corresponding to the first receiving space 211 of the first carrier 21. The third carrier 23 is further formed with a third through hole 234 at a position thereof corresponding to the first through hole 216 of the first carrier 21. The third carrier 23 is disposed with a connection plate 235 extending downward along a third direction, such as Z-direction, at a position thereof corresponding to the passing bay portion 217 of the first carrier 21.

The driving unit has at least one driver to drive the rotator to rotate along the axis so that the rotator pushes the first passive member and the second passive member of the carrier to move. Thus, the degree of freedom of the carrier can be adjusted. Specifically, the driver can be a piezoelectric element, a motor, a harmonic driver with motor, or other similar devices. In addition, the number of the driver can be alternated depending on needs.

In the present embodiment, the driving unit includes a supporter and at least one driver. The at least one driver includes a first driver 32, a second driver 33, and a third driver 34. The supporter 31 can be a machine seat or a movable seat. In the present embodiment, the supporter 31 is a movable seat and is movable along at least one direction. The first driver 32 is disposed on the supporter 31, and a first rotation axle 321 of the first driver 32 is protruded from the second through hole 233 of the third carrier 23 to drive the first roller 11 and the second roller 12 to rotate. The first roller 11 and the second roller 12 adjust degrees of freedom of the first carrier 21 along Y-direction or reversely.

The second driver 33 is disposed on the supporter 31, and a second rotation axle 331 of the second driver 33 is protruded from the third through hole 234 of the third carrier 23 and the first through hole 216 of the first carrier 21 to drive the third roller 13 and the fourth roller 14 of the second driver to rotate. The third roller 13 and the fourth roller 14 adjust degrees of freedom of the second carrier 22 along X-direction or reversely.

The third driver 34 is disposed on the supporter 31 and drives the fifth passive member of the third carrier 23 via an eccentric axle 341 so as to adjust the degree of freedom of horizontal rotation of the third carrier 23. Thus, the position and the orientation of the first carrier 21, the second carrier 22, and the third carrier 23 can be precisely alternated. In the present embodiment, the eccentric axle 341 of the third driver 34 is rotatably arranged in the recess 231 of the third carrier 23. The third carrier 23, the first carrier 21, and the second carrier 22 are driven by the rotation of the eccentric axle 341 to adjust the degree of freedom of horizontal rotation (the angle θ).

The at least one receiver 41 is movably disposed on the carrier. Specifically, the receiver 41 is movably disposed on the first carrier 21, and the second carrier 22 drives the receiver 41 to move via the third passive member 225 and the fourth passive member 227. The receiver 41 is adapted for a processing member (not shown in the drawings) to dispose in order to alternate the position and orientation of the processing member. In the present embodiment, the receiver 41 has a third receiving space 411 for receiving the second carrier 22. A first pushing portion 4121 is arranged at a side of the third receiving space 411 corresponding to the first intermediary member 226. The first pushing portion 4121 contacts the first intermediary member 226. A second pushing portion 4122 is arranged at a side of the third receiving space 411 remote from the first pushing portion 4121. A third track assembly 413 is arranged along the second direction, such as X-direction, between the receiver 41 and the first carrier 21. A third track of the third track assembly is disposed on the first carrier 21, and a third sliding seat is disposed on the receiver 41 so that the receiver 41 moves along x-direction below the first carrier 21 via the third track assembly 413.

Besides, the receiver 41 is disposed with a protection structure at at least one side thereof. The protection structure includes a first plate and a second plate spacedly arranged at at least one side of the receiver to correspond to the track assembly. Am erected plate is arranged at an adjacent side of the receiver 41 to transmit the force so as to prevent the track assembly from damaging. Thus, the track assembly becomes more durable. For example, when the erected plate is connected to the first carrier 21, the force exerted on the receiver can be transmitted to the first carrier 21 via the erected plate. When the erected plate of the receiver 41 is connected to the third carrier 23, the force can be transmitted to the third carrier 23.

In the present embodiment, the receiver 41 is disposed with protection structures at two sides thereof. Each of the protection structures has a first plate 414 and a second plate 415 spacedly arranged at a side of the receiver 41 corresponding to the third track assembly 413, and the first plate 414 is connected to the third track assembly 413. An erected plate 416 arranged along Z-direction is disposed at an adjacent side of the receiver 41. The erected plate 416 is inserted through the passing bay portion 217 of the first carrier 21 and contacts the connection plate 235 of the third carrier 23. Because the first plate 414 and the second plate 415 are spacedly arranged and not fixed to each other, the force exerted on the receiver 41 is prevented from being transmitted to the third track assembly 413. The force is transmitted to the connection plate 235 of the third carrier 23 via the erected plate 416, so the third track assembly 413 is prevented from damaging. Thereby, the third track assembly 413 becomes more durable.

However, the first pushing portion 4121 of the receiver 41 can contact the third passive member 225 of the second carrier 22 directly, and the second pushing portion 4122 of the receiver 41 can contact the fourth passive member 227 of the second carrier 22 directly too.

Figure 6:
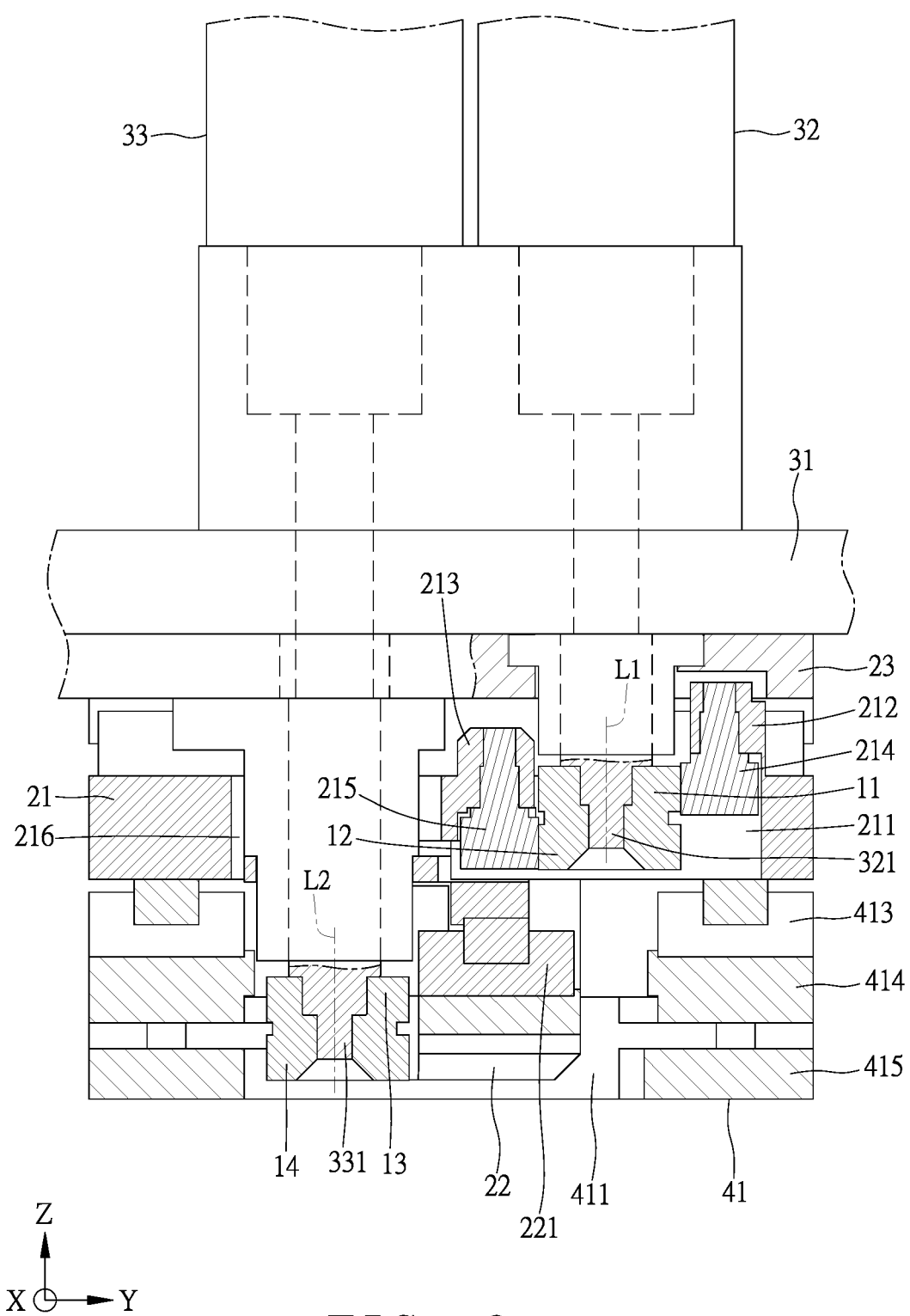
FIG. 6 is a cross-section drawing showing a carrier mechanism of the present invention.
Figure 8:
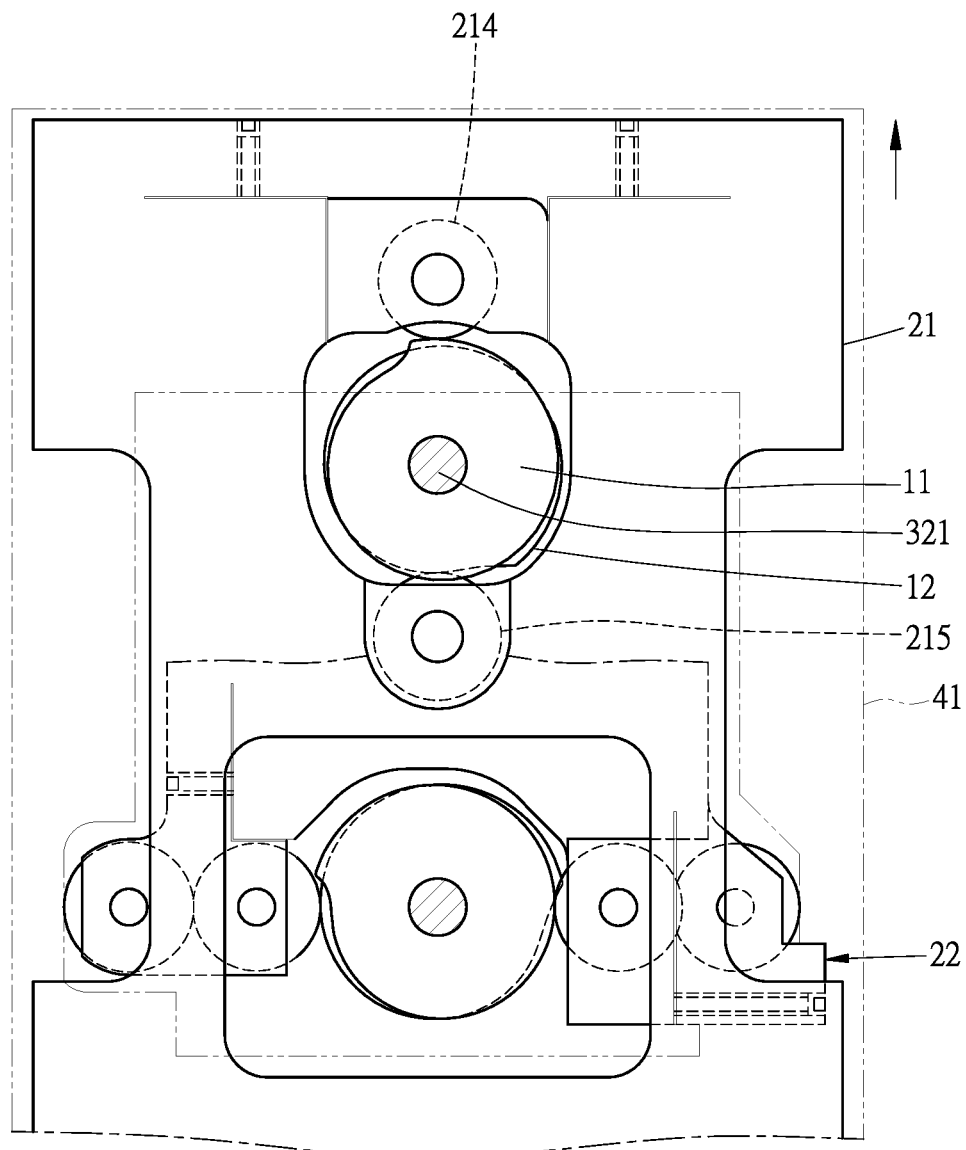
FIG. 8 is an illustration showing a carrier mechanism of the present invention during an adjustment along a first direction.
Figure 9:
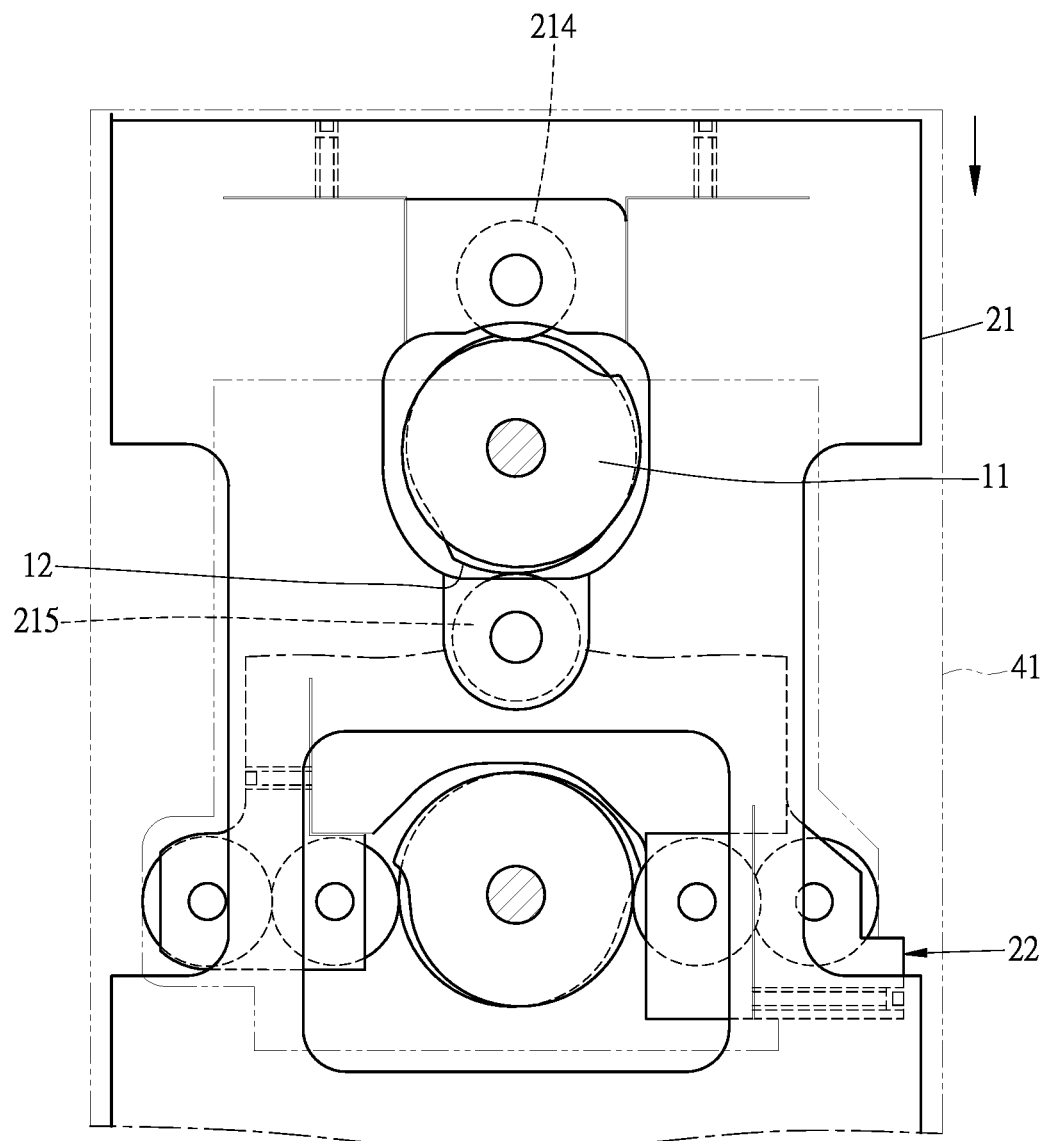
FIG. 9 is an illustration showing a carrier mechanism of the present invention during an adjustment reversely along a first direction.

Please refer to FIG. 6, FIG. 8, and FIG. 9, to adjust the position of the receiver 41 along the Y-direction, the driving unit drives the first roller 11 and the second roller 12 of the first rotator to rotate about the first axis L1 simultaneously via the first rotation axle 321 of the first driver 32. The higher arc section of the cam surface of the first roller 11 pushes the first passive member 214 of the first carrier 21 so that the rotation is converted to linear movement. Thus, the first carrier 21 is driven to move linearly along Y-direction by the first passive member 214. Because the higher arc section and the lower arc section of the cam surface of the second roller 12 is staggered from the higher arc section and the lower arc section of the cam surface of the first roller 12, the lower arc section of the cam surface of the second roller 12 contacts the second passive member 215 instead of pushing the first carrier 21 to move reversely. When the first carrier 21 moves, the second passive member 215 and the first passive member 214 keep contacting the second roller 12 and the first roller 11 to reduce the backlash so that the first carrier 21 can move smoothly. The first carrier 21 drives the second carrier 22 and the receiver 41 to move along Y-direction so as to adjust the position of the receiver 41 along Y-direction.

To adjust the receiver 41 to make it move reversely along Y-direction, the driving unit drives the first roller 11 and the second roller 12 to rotate reversely via the first rotation axle 321 of the first driver 32, and the higher arc section of the cam surface of the second roller 12 pushes the second passive member 215. The second passive member 215 then drives the first carrier 21 to move reversely along Y-direction. Because the first roller 11 contacts the first passive member 214 with the lower arc section of the cam surface thereof instead of pushing the first carrier 21 to move, the first carrier 21 drives the second carrier 22 and the receiver 41 to move reversely along Y-direction so as to adjust the position of the receiver 41 along Y-direction.

Figure 7:
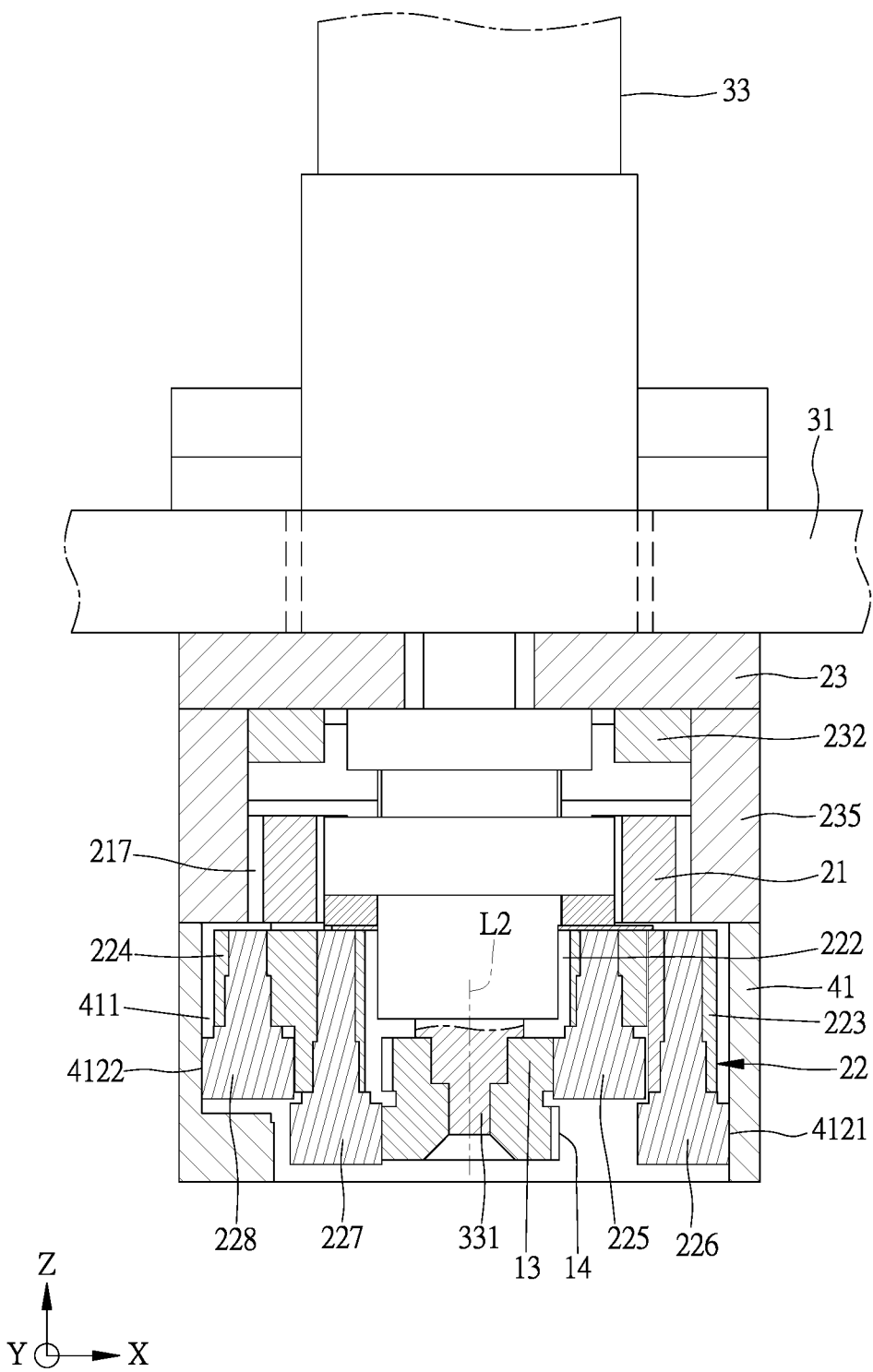
FIG. 7 is a cross-section drawing showing a carrier mechanism of the present invention.
Figure 10:
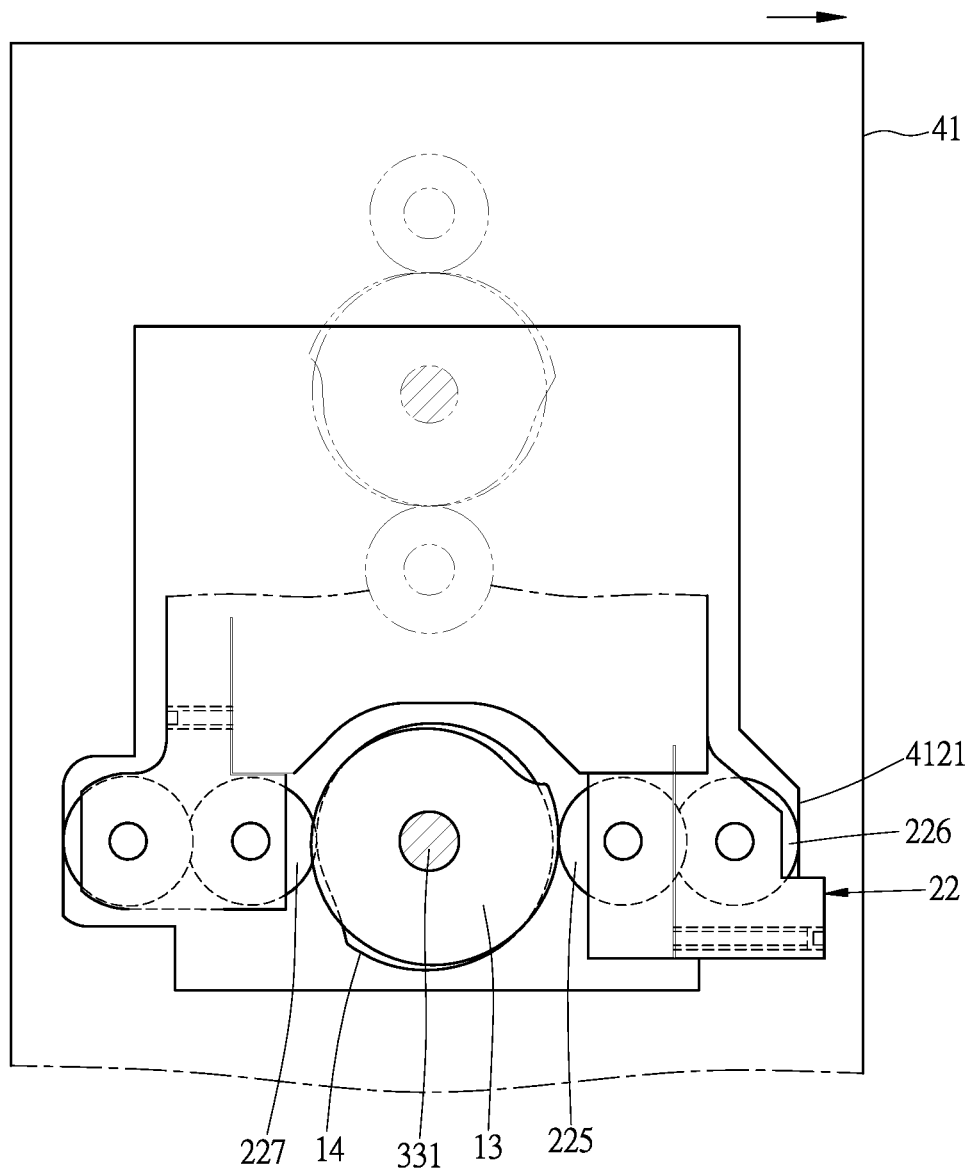
FIG. 10 is an illustration showing a carrier mechanism of the present invention during an adjustment along a second direction.
Figure 10:
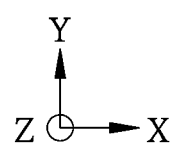
Figure 11:
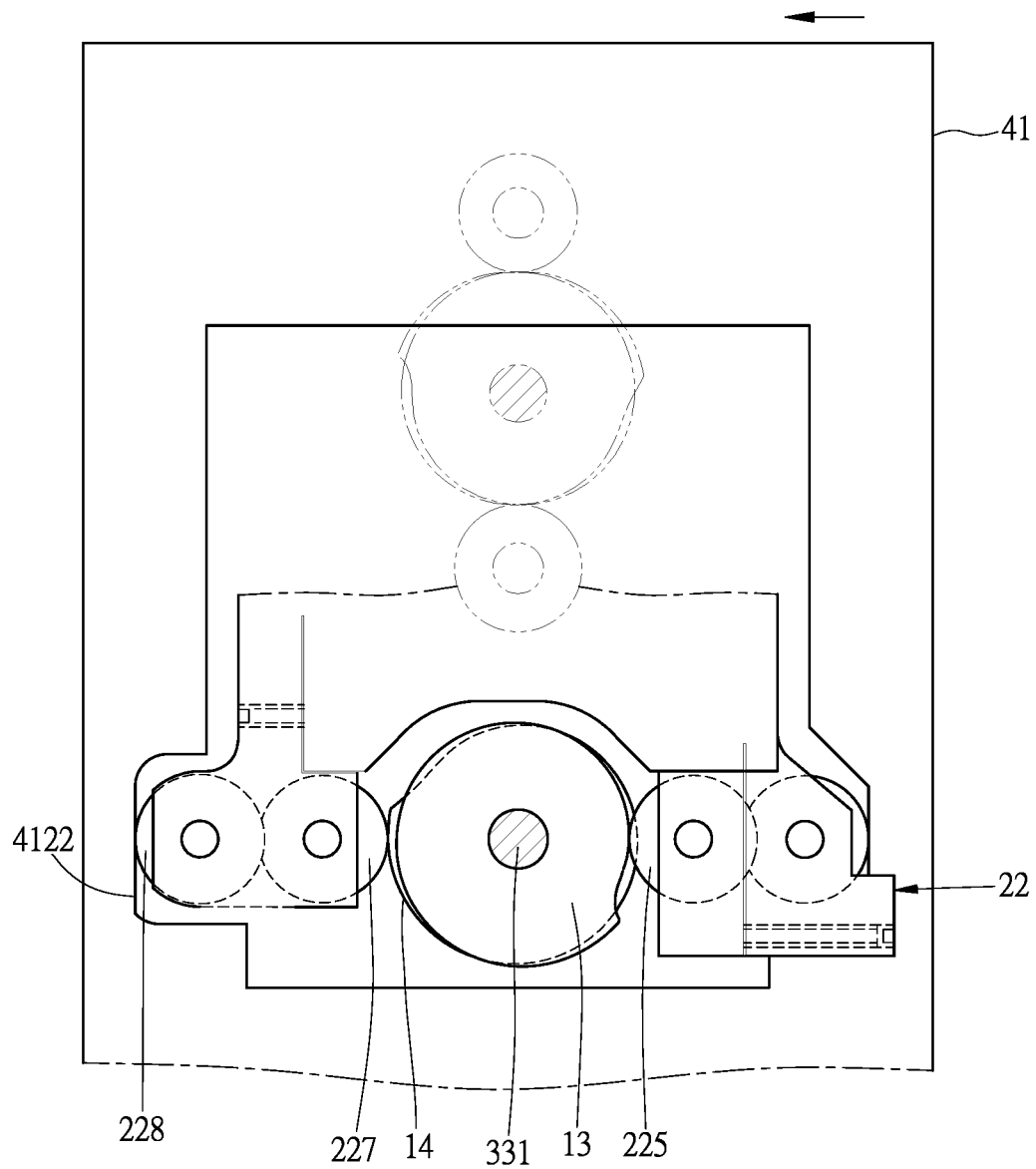
FIG. 11 is an illustration showing a carrier mechanism of the present invention during an adjustment reversely along a second direction.

Please refer to FIG. 7, FIG. 10, and FIG. 11, to adjust the position of the receiver 41 along X-direction, the driving unit drives the third roller 13 and the fourth roller 14 of the second rotator to rotate about the second axis L2 via the second rotation axle 331 of the second driver 33. The higher arc section of the cam surface of the third roller 13 pushes the third passive member 225 of the second carrier 22 so that the rotation is converted to linear movement. Thus, the second carrier 22 moves along X-direction. The second carrier 22 pushes the first pushing portion 4121 of the receiver 41 with the first intermediary member 226. The higher arc section and the lower arc section of the cam surface of the fourth roller 14 are staggered from the arc section and the lower arc section of the cam surface of the third roller 13 so that the lower arc section of the cam surface of the fourth roller 14 contacts the fourth passive member 227 instead of pushing the second carrier 22 to move reversely. When the second carrier 22 is moving, the fourth passive member 227 and the third passive member 225 keep contacting the fourth roller 14 and the third roller 13 to reduce the backlash. Thus, the second carrier 22 can move smoothly. The second carrier 22 drives the receiver 41 to move along X-direction so as to adjust the position of the receiver 41 along X-direction.

Figure 2:
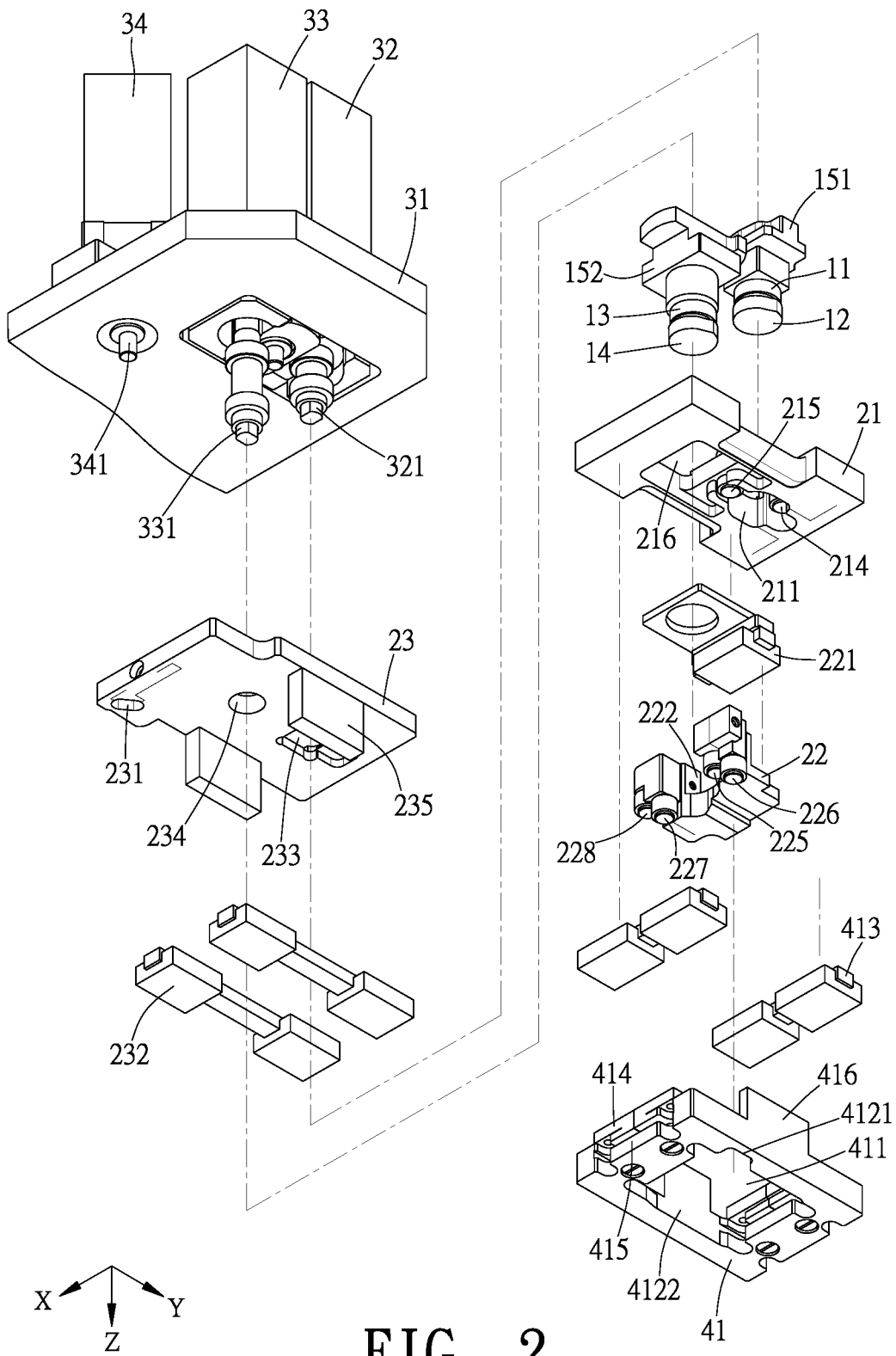
FIG. 2 is a breakdown drawing showing a carrier mechanism of the present invention.
Figure 3:
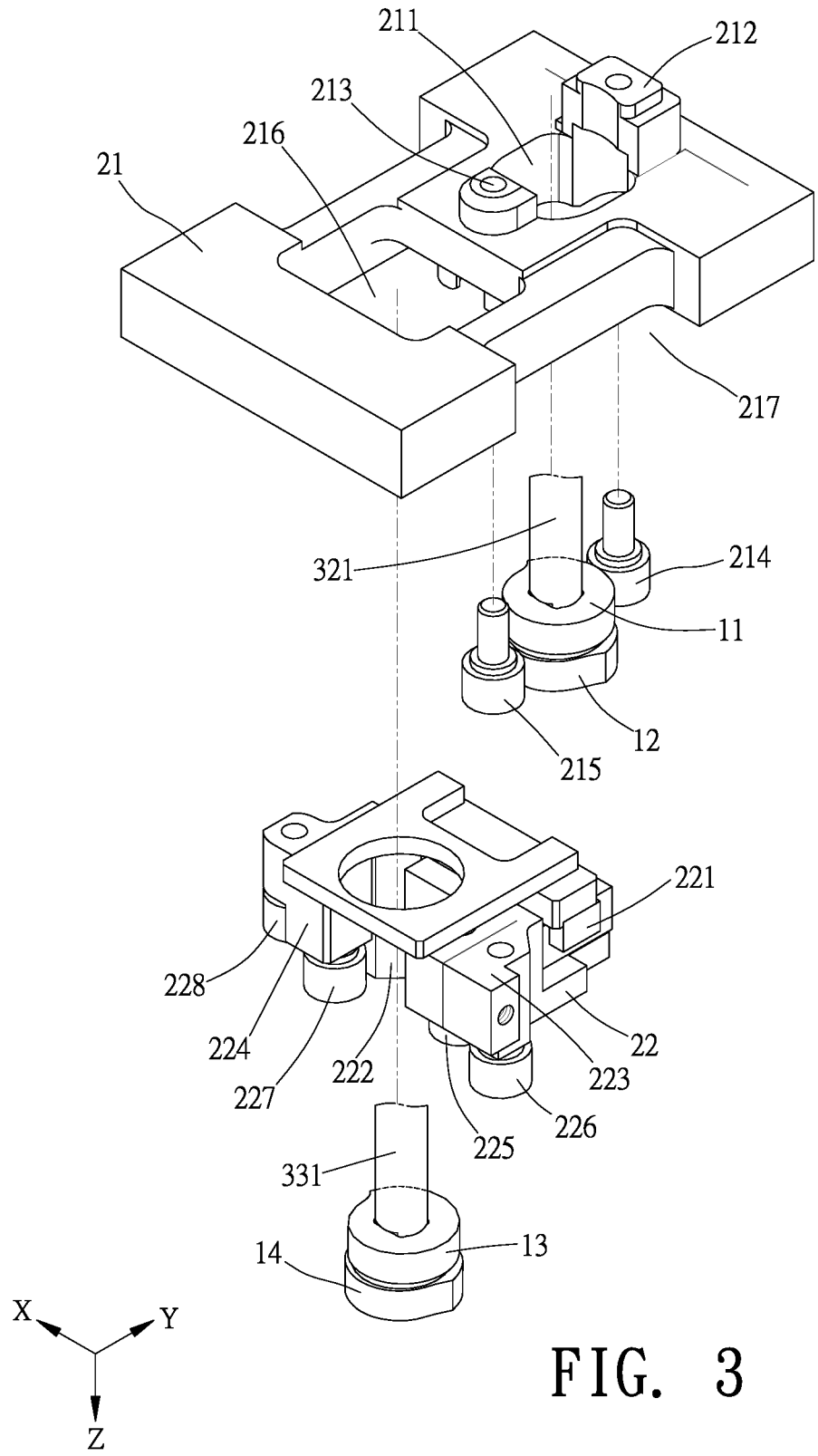
FIG. 3 is a partial breakdown drawing showing a carrier mechanism of the present invention.
Figure 4:
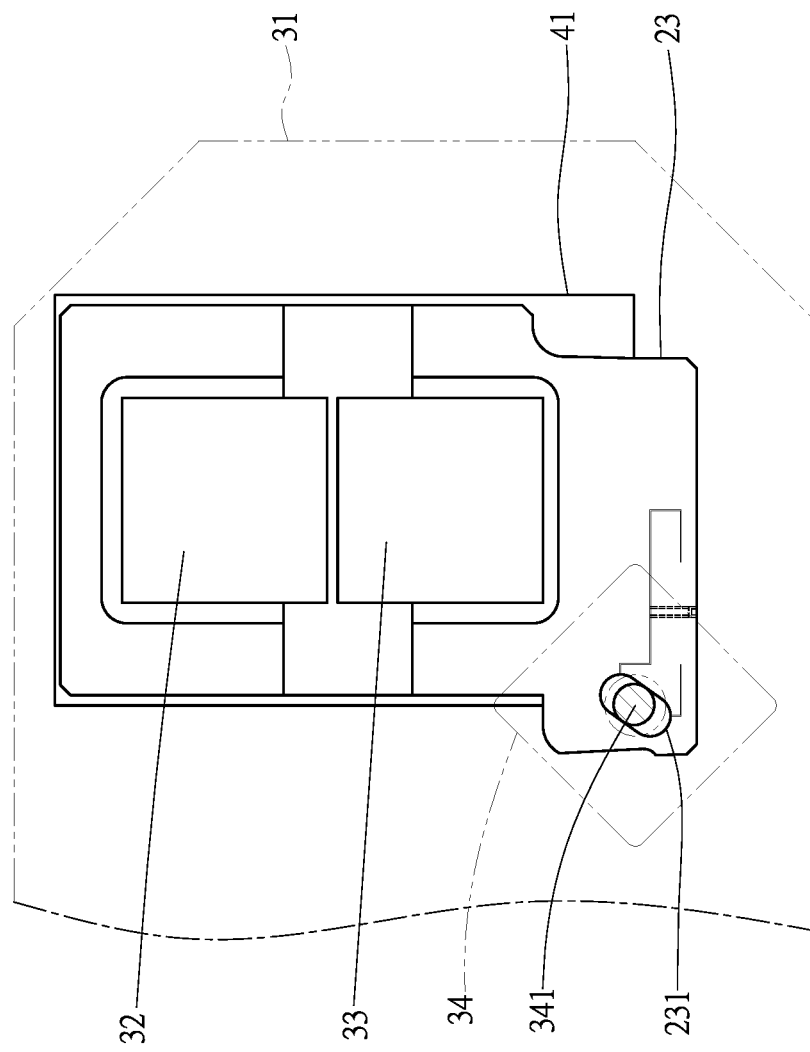
FIG. 4 is a partial top view showing a carrier mechanism of the present invention.
Figure 5:
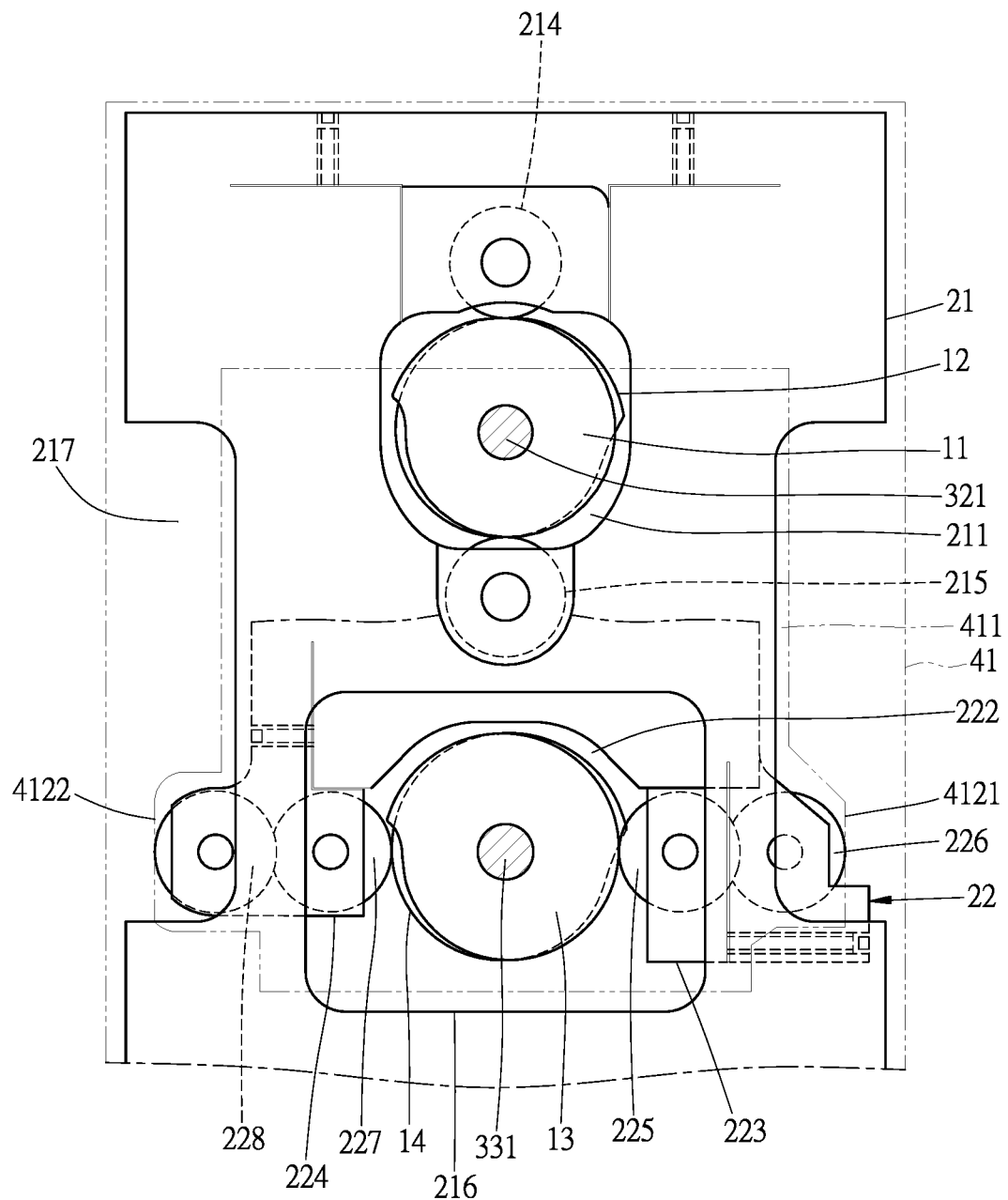
FIG. 5 is a partial top view showing a carrier mechanism of the present invention.
Figure 12:
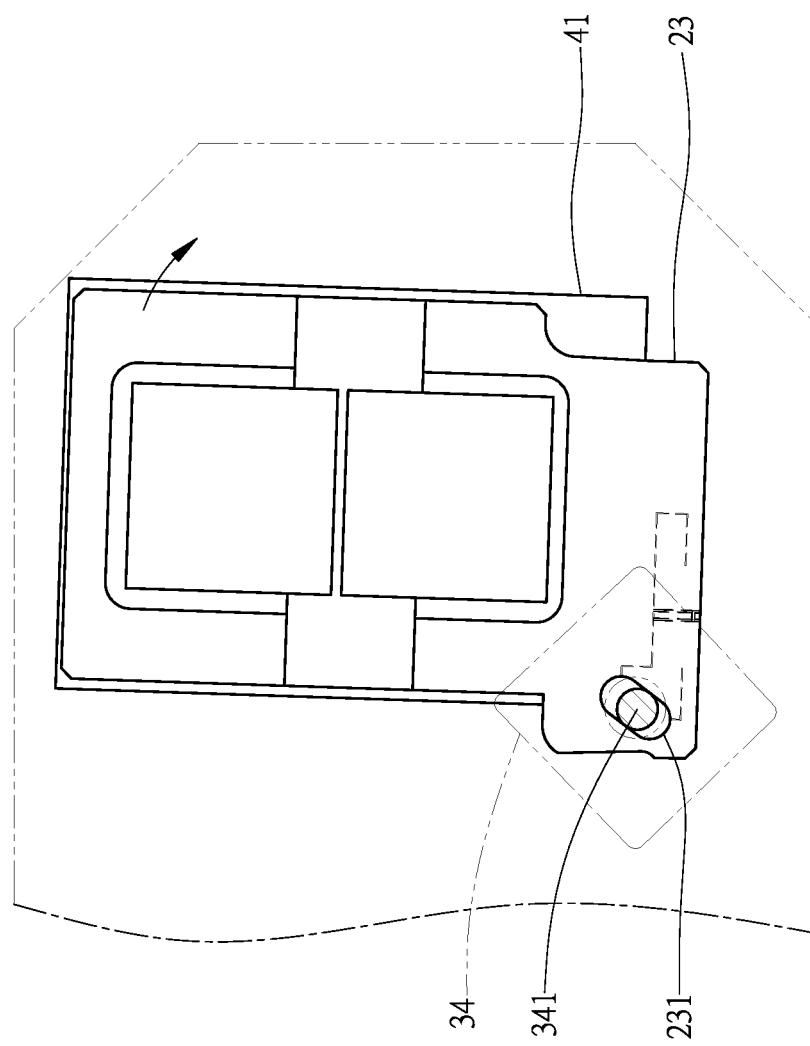
FIG. 12 is an illustration showing a carrier mechanism of the present invention during an horizontal angular adjustment.

Please refer to FIG. 2 and FIG. 12, to adjust the horizontal angle θ of the receiver 41, the driving unit drives the eccentric axle 341 to rotate in the recess 231 of the third carrier 23 via the third driver 34 so as to push the third carrier 23 to rotate horizontally in an angle of θ. Because the first carrier 21, the second carrier 22, and the receiver 41 are disposed under the third carrier 23, the horizontal angle θ of the first carrier 21, the second carrier 22, and the receiver 41 can be adjusted simultaneously by the third carrier 23.

Figure 13:
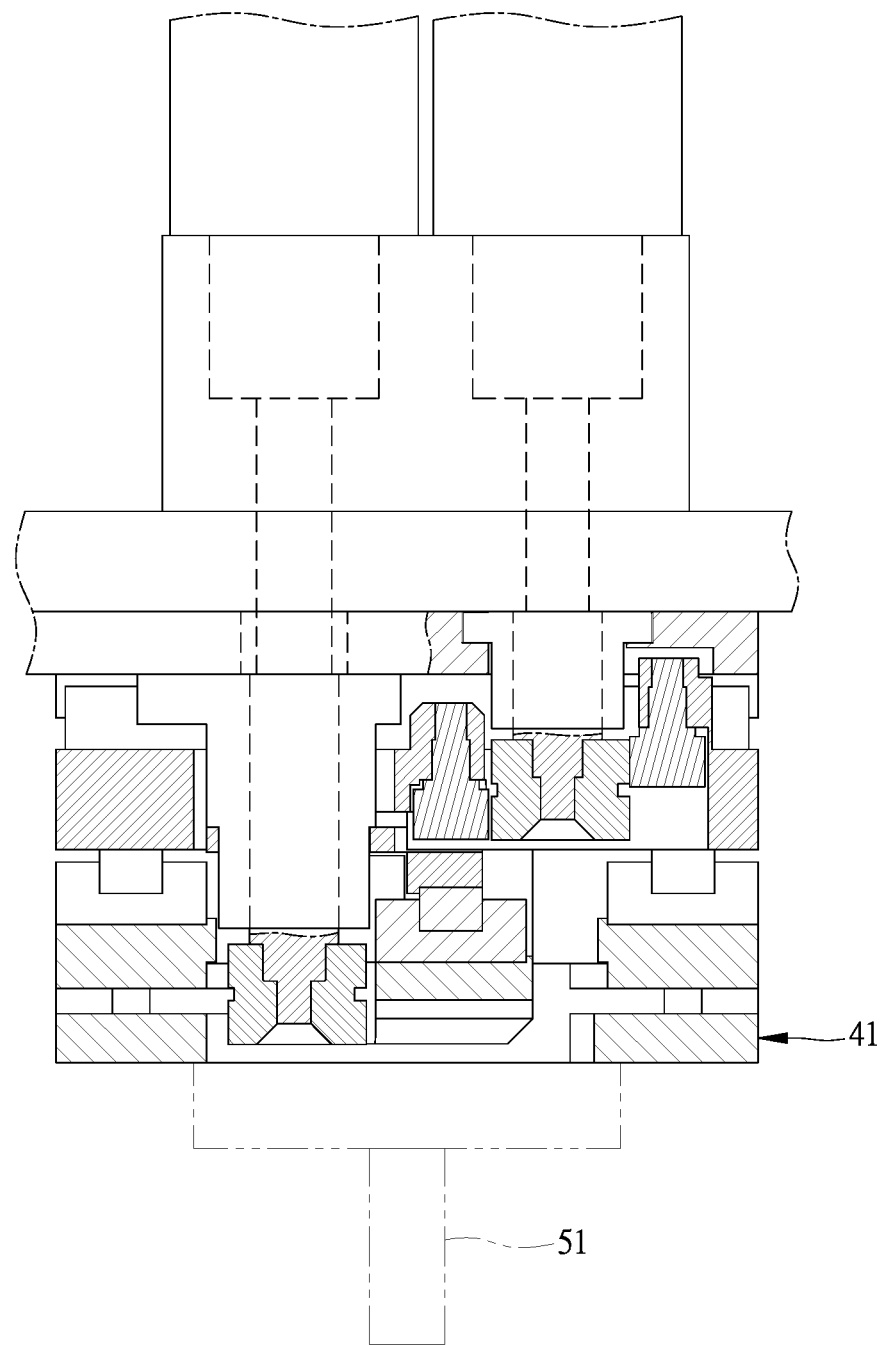
FIG. 13 is an illustration showing a carrier mechanism of the present invention with a sucker.
Figure 14:
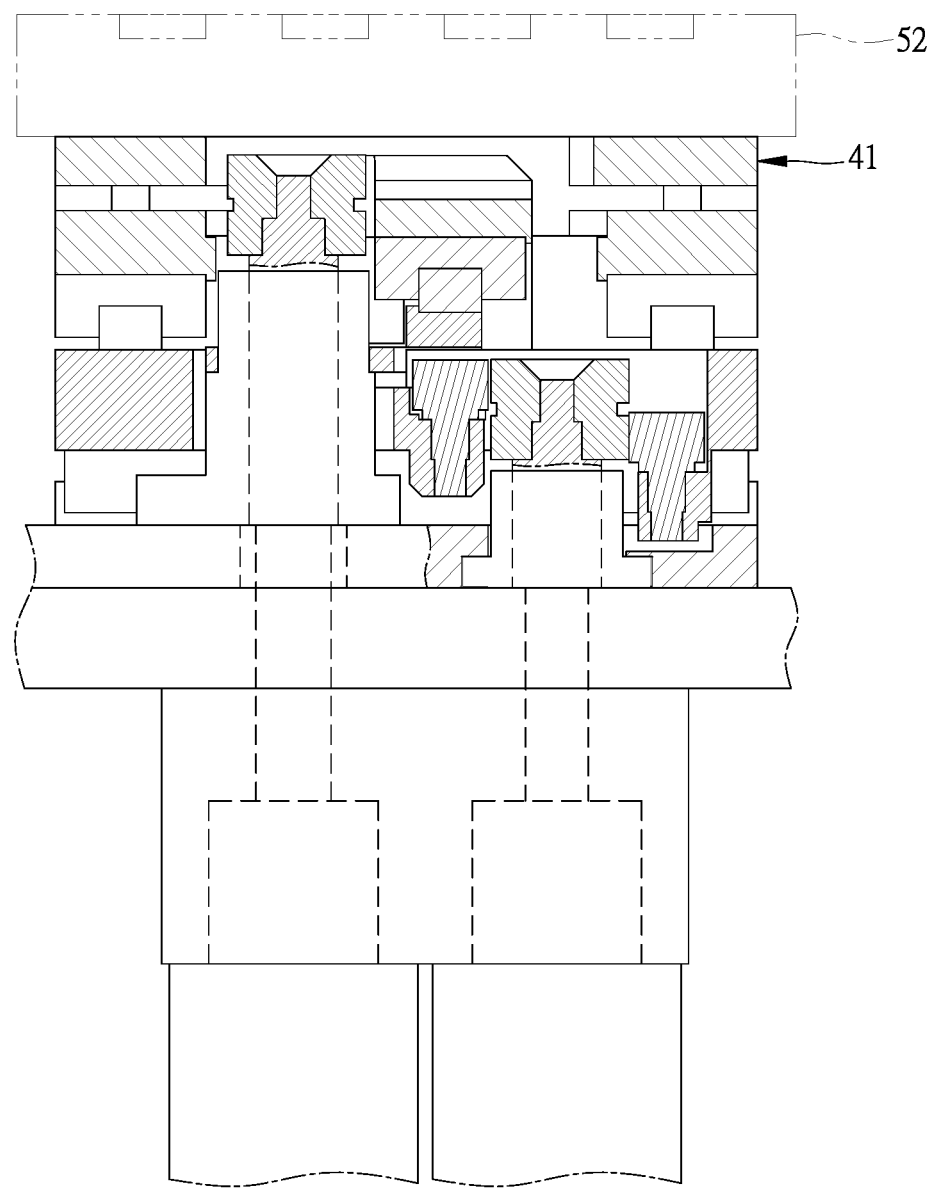
FIG. 14 is an illustration showing a carrier mechanism of the present invention with a support table.
Figure 15:
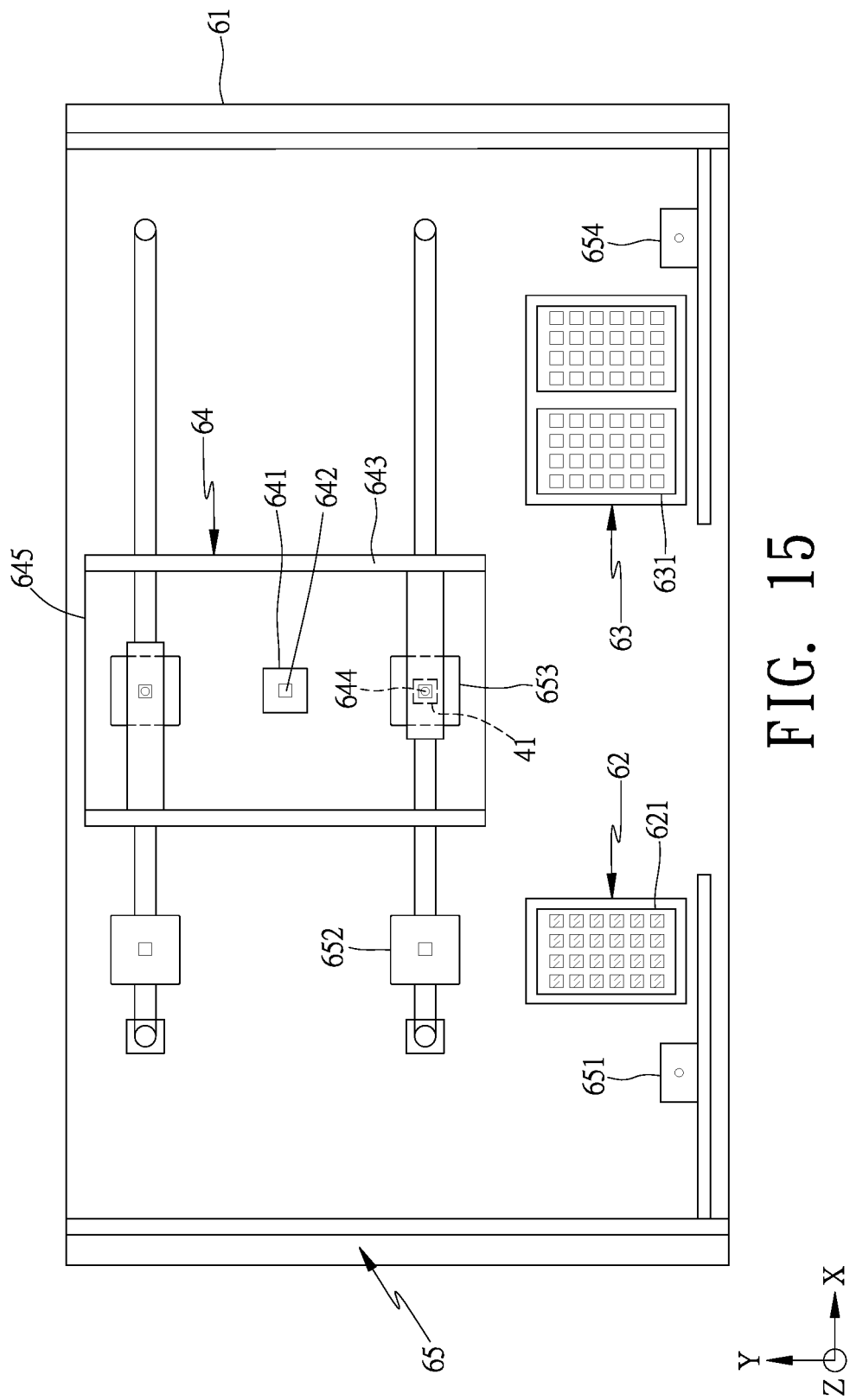
FIG. 15 is an illustration showing a processing equipment of the present invention.

The carrier mechanism can be utilized in a processing equipment and is disposed with at least one processing member on the carrier or the receiver 41. The processing member can be a pick-up member, a pressing member, a support table, a pre-heating plate, or others. The position and the orientation of the processing member can be adjusted by the carrier mechanism. As shown in FIG. 13, the processing member is a pick-up member 51 and is disposed on the receiver 41. The pick-up member 51 can move along X-direction and Y-direction and also rotate horizontally in an angle of θ so that the junctions of the electronic component (not shown in drawings) transported by the pick-up member 51 can be aligned to the probes of the testing seat (not shown in the drawings) precisely. Please refer to FIG. 14 for another example, the carrier mechanism can be reversely arranged upside down. The processing member can be a support table 52 and is disposed on the receiver 41. The support table 52 can move along X-direction and Y-direction, and also rotate horizontally in an angle of θ. Thus, a processing member (not shown in the drawings) which is a suction nuzzle can pick-up or release the electronic component precisely.

Please refer to FIGS. 1-12 and 15, the present invention provides a processing equipment of electronic component. The processing equipment includes a machine 61, a feeding device 62, a collecting device 63, a processing device 64 having the carrier mechanism, and a controlling device (not shown in the drawings), and further includes a transporting device 65. The feeding device 62 is disposed on the machine 61 and has at least one feeding receiver 621 to receive at least one electronic component to be processed. The collecting device 63 is disposed on the machine 61 and has at least one collecting receiver 631 to receive at least one electronic component which has been processed. The processing device 64 is disposed on the machine 61 and includes at least one processing member and the carrier mechanism. The processing member is disposed on the carrier mechanism to work on the electronic components. In the present embodiment, the processing device 64 is a testing device including a tester to receive and to test the electronic component. The tester includes a circuit board 641 and a testing seat 642 having probes. The testing seat 642 is adapted for testing the electronic component. The carrier mechanism is disposed on a transporting member 643. The transporting member 643 drives the carrier mechanism to move along the Y-direction and Z-direction. The receiver 41 of the carrier mechanism is adapted for the processing member which is a pressing member to dispose on in order to pressing and transporting the electronic component. The processing device 64 can further include a temperature-controlling mechanism and a testing room 645. The temperature-controlling mechanism has at least one temperature-controlling member on the processing member, and the testing room 645 covers the tester. In the present embodiment, the testing room 645 covers the testing seat 642. During the cooling test, dry air is transported to the testing room 645 via the fluid pipe. The temperature-controlling member is disposed on the pressing member 644 to control the temperature of the electronic component. Thus, the electronic component can be tested in a circumstance approaching reality. During heating test, an air blower can be arranged in the testing room 645 to provide hot air into the testing room 645. The transporting device 65 is disposed on the machine and has at least one transporter to transport the electronic components. In the present embodiment, the transporting device 65 has a first transporter 651 to pick-up the electronic components to be processed from the feeding receiver 621 of the feeding device 62. The first transporter 651 further moves the electronic components to a second transporter which is an inlet table 652. The inlet table 652 moves the electronic components to be processed to the lateral side of the processing device 64. In other possible embodiments, the inlet table 652 can move along the moving path of the pressing member 644 and transport the electronic components to the bottom side of the pressing member 644. The processing device 64 drives the carrier mechanism and the pressing member 644 to move along Y-direction and Z-direction by the transporting member 643, and the pressing member 644 picks-up the electronic components to be processed. The position and the orientation of the pressing member 644 is adjusted by the carrier mechanism so that the pressing member 644 can transport the electronic components to the testing seat 642 precisely. Thereby, the junctions of the electronic component can be aligned to the probes of the testing seat 642 precisely. The transporting member 643 further drives the pressing member 644 to move the electronic component which has been tested to a third transporter which is an outlet table 653. The outlet table 653 takes the tested electronic components out. A fourth transporter 654 of the transporting device 65 picks-up the tested electronic components from the outlet table 653 and sorts them to place them on the appropriate position of the collecting receiver 631 of the receiving device 63. The controlling device is adapted for controlling the collaboration of the devices mentioned above so that the automatic process can be achieved.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A carrier mechanism comprising:
   at least one rotator, the at least one rotator rotatable around an axis;
   a carrying unit having at least one carrier, the at least one carrier having a first passive member and a second passive member, the first passive member and the second passive member being located at two sides of the at least one rotator respectively; and
   a driving unit having at least one driver, the driving unit adapted for driving the at least one rotator to rotate around the axis so that the at least one rotator adjusts a degree of freedom of the at least one carrier along at least one direction;
   wherein the at least one rotator has at least one roller, and the first passive member and the second passive member contact two sides of the at least one roller.

2. The carrier mechanism of claim 1, wherein each of the first passive member and the second passive member has an outer surface which is compressible and deformable.

3. A processing equipment, including:
   a machine;
   a feeding device disposed on the machine, the feeding device having at least one feeding receiver for receiving electronic components to be processed;
   a collecting device disposed on the machine, the collecting device having at least one collecting receiver for receiving electronic components which have been processed;
   a processing device disposed on the machine, the processing device having the carrier mechanism of claim 1;
   a transporting device disposed on the machine, the transporting device having at least one transporter for transporting the electronic components; and
   a controlling device, for controlling collaboration of the feeding device, the collecting device, the processing device, and the transporting device.

4. A carrier mechanism comprising:
   at least one rotator, the at least one rotator rotatable around an axis;
   a carrying unit having at least one carrier, each of the at least one carrier having a first passive member and a second massive member, the first passive member and the second passive member being located at two sides of the at least one rotator respectively; and
   a driving unit having at least one driver for driving the at least one rotator to rotate around the axis so that the at least one rotator adjusts a degree of freedom of the at least one carrier along at least one direction;
   wherein the at least one rotator has a plurality of rollers, and the first passive member and the second passive member contact the rollers respectively.

5. The carrier mechanism of claim 4, wherein the at least one rotator comprises a first rotator, wherein the plurality of rollers of the first rotator rotate around a first axis, the at least one carrier comprises a first carrier, the first passive member of the first carrier and the second passive member of the first carrier are located at two sides of the first rotator, and the at least one driver comprises a first driver for driving the first rotator to rotate so that the first rotator adjusts a degree of freedom of the first carrier.

6. The carrier mechanism of claim 5, wherein an outer surface of the first passive member of the first carrier and an outer surface of the second passive member of the first carrier contact an outer surface of one of the plurality of rollers of the first rotator.

7. The carrier mechanism of claim 5, wherein the at least one rotator further comprises a second rotator, the second rotator has at least one roller rotatable around a second axis;
   wherein the at least one carrier further comprises a second carrier,
   wherein the first passive member of the first carrier and the second passive member of the first carrier are driven to move by the plurality of rollers of the first rotator, the second carrier is movably disposed on the first carrier, the first passive member of the second carrier and the second passive member of the second carrier are driven to move by the at least one other roller of the second rotator; and wherein the driving unit has a first driver and a second driver, the first driver drives the first rotator and the second driver drives the second rotator to rotate respectively so that the first rotator and the second rotator adjust a plurality of degrees of freedom of the first carrier and the second carrier.

8. The carrier mechanism of claim 7, wherein the plurality of rollers of the first rotator comprises a first roller and a second roller, the first roller and the second roller rotate around the first axis, the second rotator comprises a third roller and a fourth roller, the third roller and the fourth roller rotate around the second axis, the first passive member of the first carrier is located at a side of the first roller, the second passive member of the first carrier is located at a side of the second roller remote from the first passive member of the first carrier, the first passive member of the second carrier is located at a side of the third roller, the second passive member of the second carrier is located at a side of the fourth roller remote from the first passive member of the second carrier.

9. The carrier mechanism of claim 8, wherein an outer surface of the first passive member of the first carrier contacts an outer surface of the first roller, an outer surface of the second passive member of the first carrier contacts an outer surface of the second roller, an outer surface of the first passive member of the second carrier contacts an outer surface of the third roller, an outer surface of the second passive member of the second carrier contacts an outer surface of the fourth roller.

10. The carrier mechanism of claim 7, wherein the first carrier has a first receiving space for the first rotator to insert through, the first passive member of the first carrier and the second passive member of the first carrier are arranged at two sides of the first receiving space, the first carrier is formed with a first through hole to allow the second rotator to protrude outside.

11. The carrier mechanism of claim 7, wherein a first track assembly arranged along a first direction is disposed between the first carrier and the second carrier, the second carrier has a second receiving space for the second rotator to insert through, the first passive member of the second carrier and the second passive member of the second carrier are arranged at two sides of the second receiving space.

12. The carrier mechanism of claim 7, wherein the driving unit has a supporter, and the supporter is adapted for the first driver and the second driver.

13. The carrier mechanism of claim 7, wherein the at least one carrier further comprises a third carrier, the third carrier is disposed on the first carrier, the driving unit has a third driver, the third driver drives the first passive member of the third carrier to rotate via an eccentric axle so as to adjust a degree of freedom of horizontal rotation of the third carrier.

14. The carrier mechanism of claim 13, further comprising a second track assembly arranged along a second direction, wherein the second track assembly is disposed between the third carrier and the first carrier.

15. The carrier mechanism of claim 7, further including at least one receiver, the at least one receiver being movably arranged on the first carrier, the second carrier driving the receiver to move simultaneously via the first passive member of the second carrier and the second passive member of the second carrier.

16. The carrier mechanism of claim 15, further comprising a third track assembly disposed between the first carrier and the receiver, and wherein the receiver is disposed with a protection structure at least one side thereof, the protection structure includes a first plate and a second plate separately arranged on a position of receiver corresponding to the third track assembly, and an erected plate is formed at an opposite side of the receiver.

17. The carrier mechanism of claim 15, wherein a first intermediary member is arranged between the first passive member of the second carrier and the receiver.

18. The carrier mechanism of claim 15, wherein a second intermediary member is arranged between the second passive member of the second carrier and the receiver.

* * * * *